United States Patent [19]

Biermann et al.

[11] Patent Number: 5,754,404
[45] Date of Patent: May 19, 1998

[54] IC CARD REAR BOARD-CONNECTOR SUPPORT

[75] Inventors: Werner Biermann, Winterbach; Jan Zeyfang, Leutenbach, both of Germany; Gary Cain Bethurum, Laguna Niguel, Calif.

[73] Assignee: ITT Cannon GmbH, Weinstadt, Germany

[21] Appl. No.: 719,855

[22] Filed: Sep. 25, 1996

[30] Foreign Application Priority Data

May 14, 1996 [DE] Germany ............... 296 08 578 U
Jul. 11, 1996 [DE] Germany ............... 296 12 058 U

[51] Int. Cl.⁶ ............................................. H05K 1/14
[52] U.S. Cl. ............................ 361/737; 361/740; 361/741; 361/747; 361/756; 361/759; 361/801; 361/802; 361/742; 361/758; 361/770; 439/946
[58] Field of Search .......................... 361/752, 737, 361/736, 740, 741, 742, 745, 747-749, 753-754, 756, 758-759, 770, 801-803, 820; 235/435, 492, 380, 441, 487; 439/76.1, 946

[56] References Cited

U.S. PATENT DOCUMENTS

| | | | |
|---|---|---|---|
| 3,216,580 | 11/1965 | Fricker, Jr. ............... | 211/41 |
| 3,803,533 | 4/1974 | Taplin ..................... | 339/91 |
| 5,038,250 | 8/1991 | Uenaka et al. .......... | 361/395 |
| 5,053,613 | 10/1991 | Onoda ..................... | 235/492 |
| 5,187,642 | 2/1993 | Garner et al. ........... | 361/386 |
| 5,207,586 | 5/1993 | MacGregor et al. ..... | 439/76 |
| 5,244,397 | 9/1993 | Anhalt ..................... | 439/101 |
| 5,319,516 | 6/1994 | Perkins ................... | 361/220 |
| 5,330,360 | 7/1994 | Marsh et al. ............ | 439/76 |
| 5,333,100 | 7/1994 | Anhalt et al. ........... | 361/818 |
| 5,413,490 | 5/1995 | Tan et al. ................ | 439/76 |
| 5,445,525 | 8/1995 | Broadbent et al. ...... | 439/64 |
| 5,457,601 | 10/1995 | Georgopulos et al. ... | 361/686 |
| 5,463,531 | 10/1995 | Choon et al. ........... | 361/737 |
| 5,469,332 | 11/1995 | Alvité ..................... | 361/737 |
| 5,476,387 | 12/1995 | Ramey et al. ........... | 439/76.1 |
| 5,477,421 | 12/1995 | Bethurum ................ | 361/818 |
| 5,477,426 | 12/1995 | Bethurum ................ | 361/737 |
| 5,493,477 | 2/1996 | Hirai ....................... | 361/737 |

FOREIGN PATENT DOCUMENTS

| | | |
|---|---|---|
| 0590429 | 9/1993 | European Pat. Off. . |
| 4001957 A1 | 1/1994 | Germany . |
| 4406644 A1 | 3/1994 | Germany . |
| WO9524020 | 3/1994 | WIPO . |

OTHER PUBLICATIONS

ITT Cannon Catalog entitled "StarCard II PCMCIA I/O Card Kit"; Oct. 1994.
Methode Electronic Catalog Entitled "P.C. Card Products"; Undated.

Primary Examiner—Leo P. Picard
Assistant Examiner—Phuong T. Vu
Attorney, Agent, or Firm—Freilich Hornbaker Rosen

[57] ABSTRACT

A frameless IC card is provided, with front and rear support structures that each includes an electrical connector, with a sheet metal cover mounted on the front and rear board supports without requiring a separate plastic frame to tie the components together. The rear support structure includes at least one rear connector (11', 12', FIG. 3) fixed to the circuit board rear end (104') and an end cap (16') at the rear of the IC card. The end cap has upper and lower flanges (126T, 126B) that form a recess therebetween that closely receives the rear of the rear connector housing to fix their relative vertical positions. The rear end cap has forwardly-extending legs (47, 48) at opposite sides, with each leg having a lug (51, 52) forming a rearwardly-facing shoulder (150) that fits into a cutout (53) at a side of the circuit board, to prevent forward movement of the connector and circuit board out of the rear end cap. Different types of IC cards have their circuit boards at different heights, which is accomplished by mounting the rear connector at different heights on the circuit board.

11 Claims, 5 Drawing Sheets

IC CARD REAR BOARD-CONNECTOR SUPPORT

BACKGROUND OF THE INVENTION

IC cards include a circuit board with electrical components thereon such as integrated circuits, a front connector that can mate with a connector of an electronic device (e.g. laptop computer) when the IC card is inserted into a slot therein, and a sheet metal cover that surrounds the circuit board.

U.S. Pat. Nos. 5,207,586 and 5,244,397 show IC cards with molded plastic frames that tie all the parts together. U.S. Pat. No. 5,477,426 and German Publication DE 44 06 644 A1, show a frameless IC card which eliminates a molded plastic frame. The frame is eliminated by directly mounting the front and rear of the circuit board on front and rear connectors, and by mounting the sheet metal cover directly on the connectors.

In the later two references, the front and rear connectors each have upstanding pegs that fit into holes in the circuit board, with the pegs having steps that hold the circuit board at different heights, depending upon the size of holes drilled in the circuit board ends. While the pegs limit downward movement of the circuit board, means such as adhesive are required to prevent the circuit board from being moved up. In some types of IC cards, only a single small rear electrical connector is required at one side, or two small rear electrical connectors are required on opposite sides of the rear. It would be desirable if an IC card with at least one rear connector, could be constructed using available types of connectors that mount on circuit boards, in a structure that fixed the vertical height of the connector and circuit board in both upward and downward directions, as well as in forward and rearward directions.

SUMMARY OF THE INVENTION

In accordance with one embodiment of the present invention, an IC card is provided with a rear board support structure which connects circuit boards lying at different heights to a connector that lies at a single predetermined height and that is accessible from the rear of the board, using a minimum of tooling-expensive parts (especially complex injection molded parts). The rear board support structure includes an injection molded plastic rear end cap with an access opening. A connector is mounted on the rear of the circuit board at a selected height, and has a connector rear end. The connector rear end is closely received by the rear end cap to prevent relative vertical movement between them. Since the height of the connector is fixed by the rear end cap, the height of the rear of the circuit board is fixed by the level at which the rear connector is mounted to the rear of the circuit board.

The rear end cap has laterally spaced opposite sides, and has a forwardly-extending leg at each side. Each leg has a forward end with a lug forming a rearwardly-facing shoulder. Each side of the circuit board has a cutout that forms a forwardly-facing shoulder that is engaged by the lug at the front end of the leg. Accordingly, the legs prevent forward movement of the connector out engagement with the rear end cap. The shoulders on the leg lugs, are engageable with the board shoulder at each of a plurality of different heights of the board with respect to the rear end cap.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
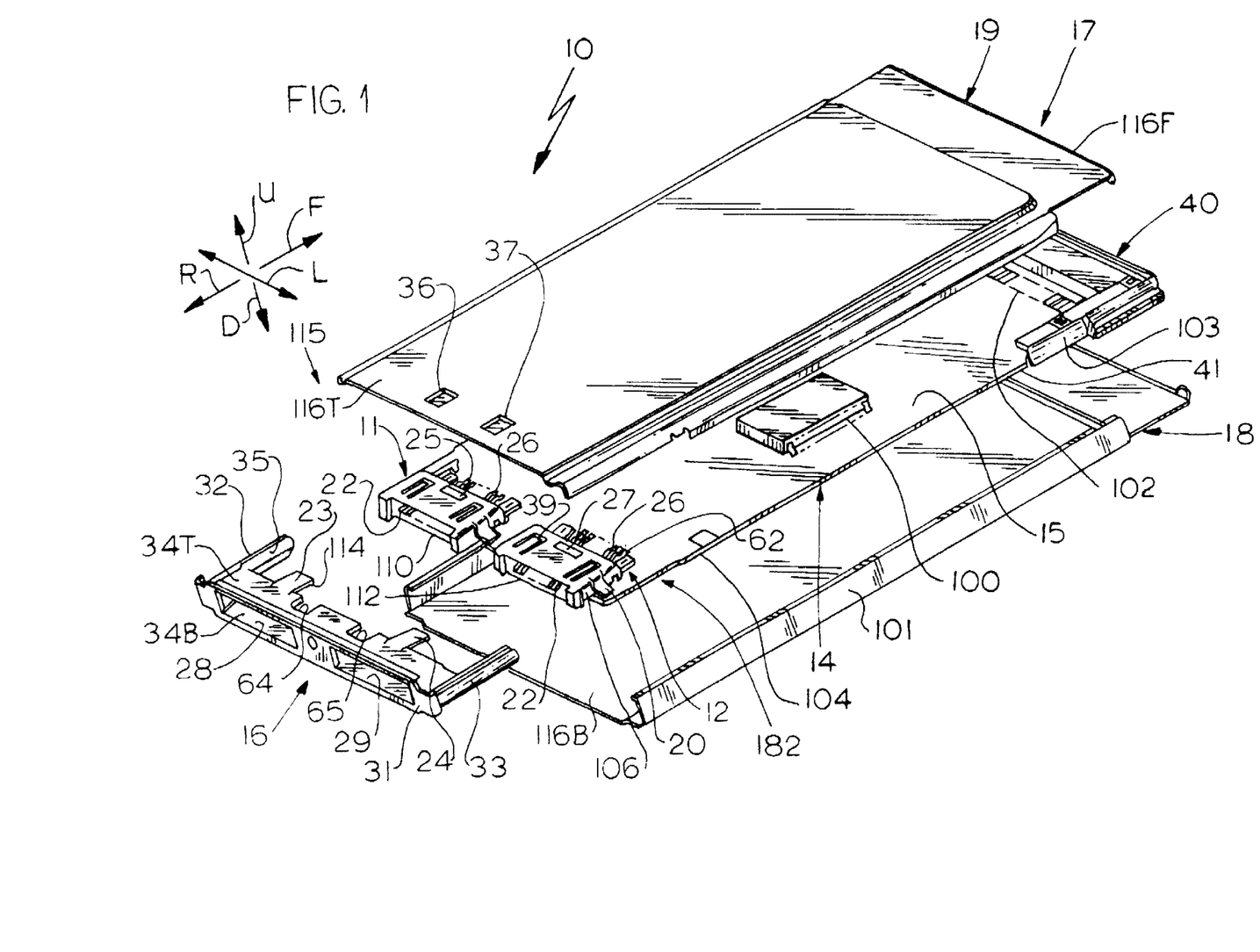
FIG. 1 is an exploded isometric view of an IC card, constructed in accordance with a first embodiment of the invention.

FIG. 1 illustrates the parts of an IC card 10 which is constructed in accordance with JEIDA standards for a type II card, which has a card length in forward and rearward directions F, R of 85.6 mm, a width in a lateral direction L of 54 mm, and a thickness in upward and downward directions U, D of a maximum of 5 mm. The card includes a sheet metal housing 17 with bottom and top housing parts 18, 19 that are latched together in the fully assembled card. A circuit board 14 carrying electronic components such as an integrated circuit 100 on the board upper face 15, lies within the sheet metal housing. The circuit board lies laterally between opposite largely vertical sides 101 of the sheet metal housing. A front board support structure is in the form of a connector 40 that is attached to the front end of the circuit board 14. The front end of the circuit board carries a laterally-extending row 102 of contact pads, and the front connector 40 has a row of contacts with tails engaging the front contact pads. The front connector 40 is usually a 68 pin connector with the pins arranged in two vertically spaced rows. As described in U.S. Pat. No. 5,477,426, the front connector has opposite side parts 103 with pegs that are received in holes drilled in the front of the circuit board. The rear end portion 104 of the circuit board carries two rear connectors 11, 12 that are laterally spaced from each other along the rear of the circuit board. Each connector includes a metal shell 106 with tabs 20 that are fixed to the circuit board, as by soldering them to solder pads on the board.

The IC card includes a rear end cap 16 which is a plastic injection molded part. Each of the connectors 11, 12 has a rear end 110, 112 with exposed pin contacts 22 (pin portions at their rear mating ends) thereat, which are aligned with access opening 28, 29 of the rear end cap, so that an external plug can be plugged into the connectors 11, 12. The combination of the rear end cap 16 and one or two of the connectors 11, 12 serves as a rear board support structure 115 that fixes the circuit 14 to the rear end cap in at least some directions.

The particular end cap 16 has forwardly-projecting retaining legs or fingers 23, 24 at their tops, which have lugs in the form of downward projections 114 at their front ends. The lugs 114 fit into slots 25, 27 at the upper ends of the rear connector shells 106. This prevents relative forward-rearward (F, R) movement of the end cap 16 to the rear connector and the circuit board.

The rear end cap 16 has laterally opposite sides with a forwardly-projecting leg 32, 33 at each side. Each leg 32, 33 covers one side edge of the circuit board rear end, and lies between the circuit board rear edge and a side of the sheet metal housing 17.

FIG. 1 also shows that the rear end cap 16 has top and bottom flanges 34T, 34B which support the rear ends 116T, 116B of the top and bottom sheet metal housing parts 19, 18 (which lie opposite the front ends 116F). The rear ends of the rear connectors are closely held between the flanges 34T, 34B to fix the connectors and rear end cap with respect to the vertical directions (U, D). The sheet metal housing parts have depressions 36, 37 on each housing half received in a corresponding one of the recesses 64, 65 in the flanges. The rear end cap has a rear wall 31 that blocks the rear of the IC card, except for the access opening 28, 29. If only one rear connector is required, then the rear wall 31 is made to cover such area. Each of the rear connectors 11, 12 has a row of pin contacts 22 with contact tails 26 that are engaged with contact pads on the circuit board. Each connector lies in a slot formed at the rear of the board. Each of the legs 32, 33 has a stepless inner surface 35 that engages a side edge of the circuit board.

Figure 2:
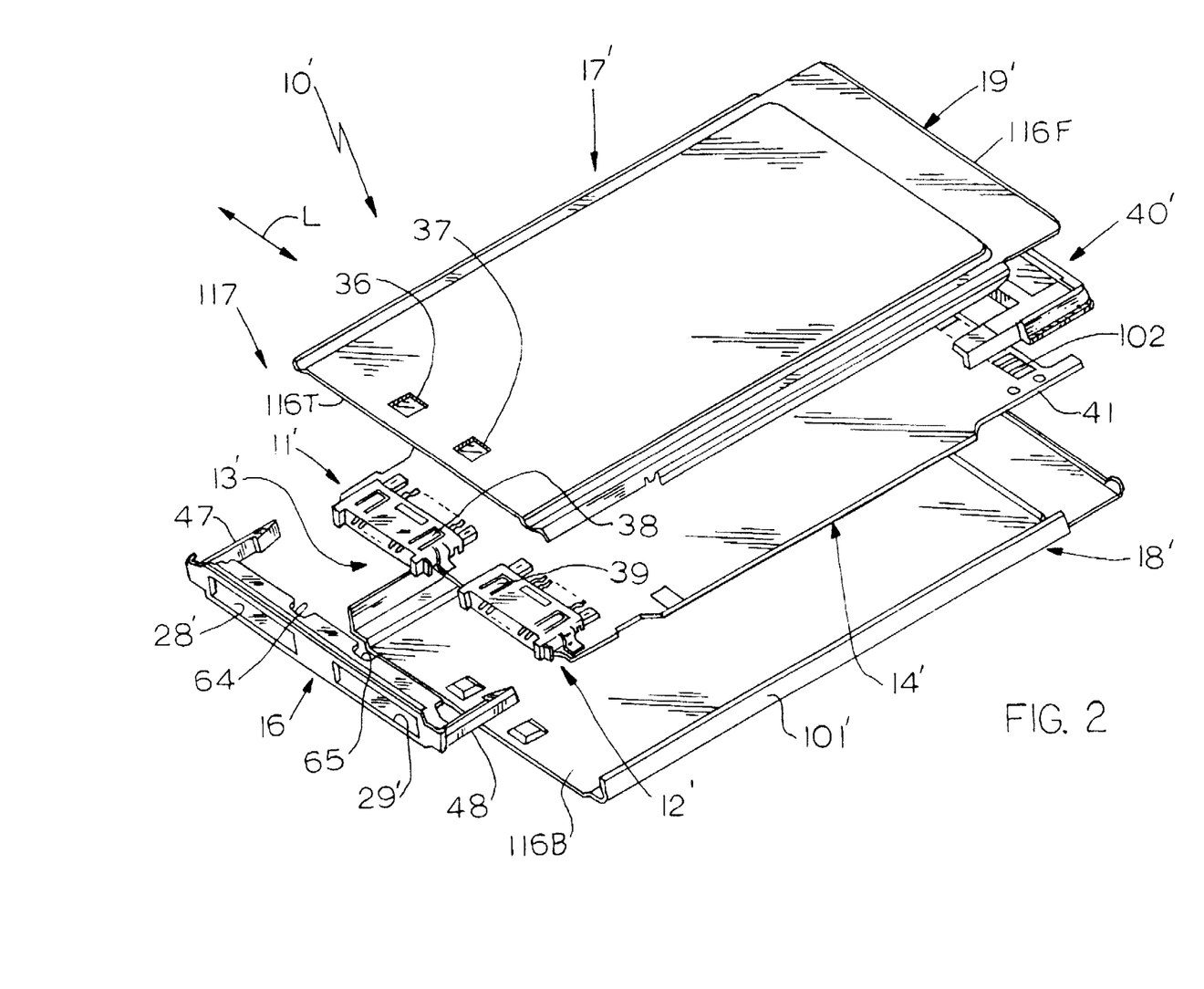
FIG. 2 is an exploded isometric view of an IC card constructed in accordance with a second embodiment of the invention.

FIG. 2 illustrates an IC card 10' which is similar to that of FIG. 1, with a sheet metal housing 17' that includes interfitting bottom and top housing portions 18', 19' having largely vertical sides 101', a front connector 40', a circuit board 14', a pair of rear connectors 11', 12', and a rear end cap 16'. The rear end cap has a pair of access openings 28', 29' for passing plug contacts to engage contacts of the rear connectors 11', 12'. However, instead of providing retention fingers similar to those shown at 23, 24 in Fig. 1, applicant forms legs 47, 48 that latch the rear end cap 16' to the circuit board, as well as laterally (L) spacing the circuit board edges against the sides of the sheet metal cover. The cap 16' and rear connectors 11', 12' form a rear board supporting structure 117.

Figure 3:
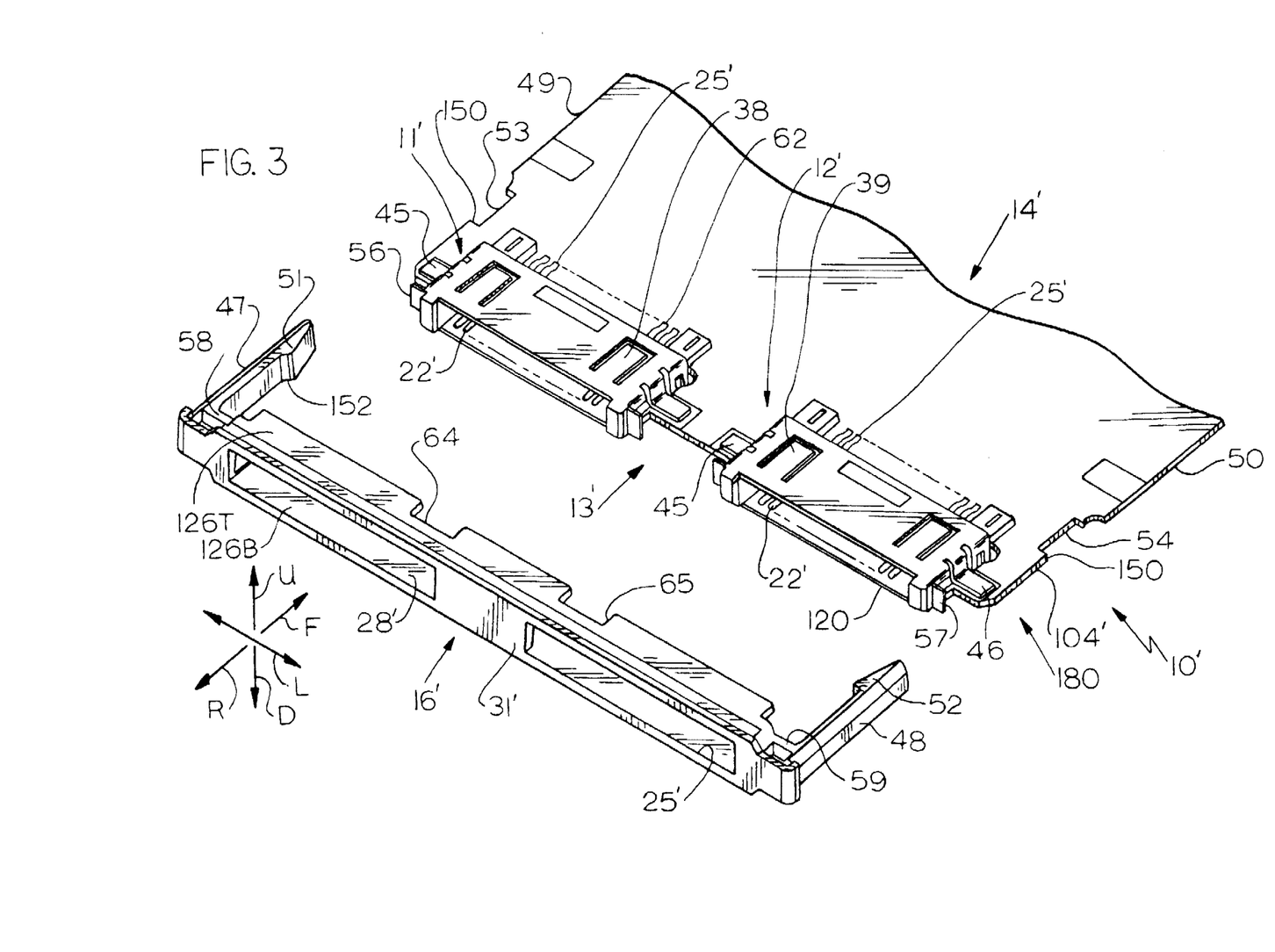
FIG. 3 is an exploded isometric view of the IC card of FIG. 2, but showing only the end cap, a pair of connectors, and a rear portion of the circuit board.
Figures 6, 7, 8:
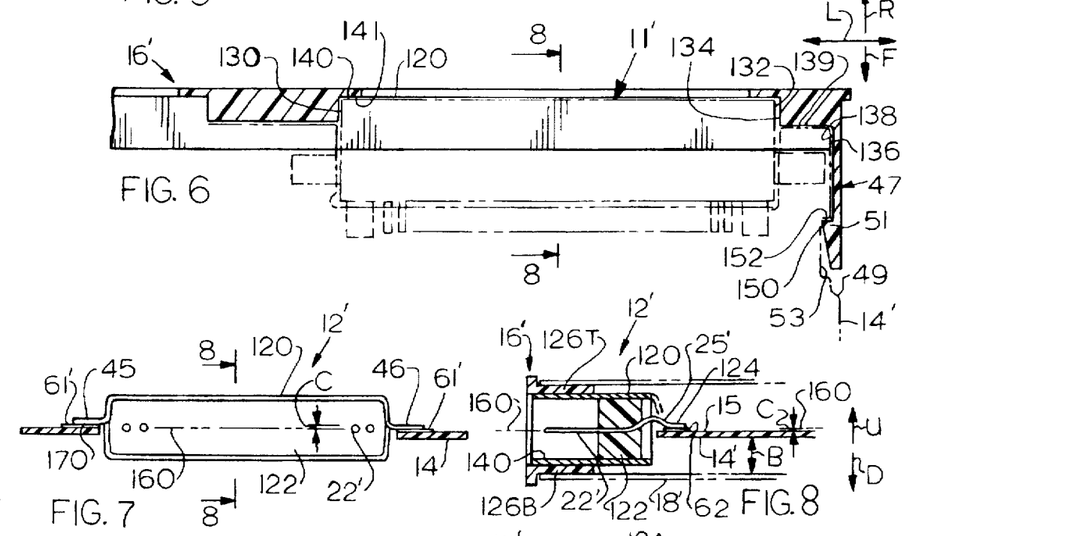
FIG. 6 is a view taken on line 6—6 of FIG. 5.
FIG. 7 is a front elevation view of the rear end connector and circuit board of FIG. 6.
FIG. 8 is a sectional view taken on lines 8—8 of FIG. 6 and on lines 8—8 of FIG. 7.

FIG. 3 shows details of the rear end cap 16', of the end connectors 11', 12', and of the rear end or rear end portion 104' of the circuit board 14'. Each connector includes an electromagnetic-shielding sheet metal housing 120 with a pair of mounting plates or tabs 45, 46 at opposite sides that mount on the circuit board as by soldering to pads thereon. As shown in FIG. 8, the connector 12' includes a row of pin contacts 22' molded into a plastic insert 122 that is held in the sheet metal housing 120. The connector housing 120 is mounted on the circuit board 14' by laying the mounts or tabs 45, 46 (FIG. 7) on solder pads 61' and soldering the tabs in place. It is possible to use a rear connector without a metal shell, by constructing a plastic insert to form the connector housing that mounts at a selected height, directly on the circuit board (e.g. as with insert pegs that fit into board holes).

FIG. 8 shows that the contacts 22' have contact tails 25' that are soldered to each solder pad 62 of a row of such pads.

The connector 12' is received in the rear end cap 16', in close vertical fit therein between the upper and lower flanges 126T, 126B, so there is no substantial relative vertical movement in the directions U, D. As shown in FIG. 6, relative lateral (L) movement of a rear electrical connector such as 11' with respect to the rear end cap 16' can be substantially eliminated by the opposite sides 130, 132 of the connector being closely received in a forwardly-opening recess 134 of the rear end cap. Alternatively or in addition, relative lateral movement can be prevented by the side edge part 136 of the circuit board engaging a wall 138 of the rear end cap.

Relative forward-to-rearward movement (F, R) of the circuit board 14' to the end cap 16' is prevented in two ways. One way is that the housing 120 of the rear electrical connector has a front end 140 that abuts a wall 141 at the front of the end cap recess 134. (The circuit board side edge parts have rear surfaces 139 that also can do this). Forward movement (F) of the circuit board and connector out of the end cap 16' is prevented by latch legs such as 47.

FIG. 3 shows that the rear end cap 16' has forwardly-projecting latch legs 47, 48 at its opposite sides, with each latch leg having a projection or lug 51, 52. The circuit board edges 49, 50 have indentations or cutouts 53, 54 that form forwardly-facing shoulders 150. Each lug such as 51 at the front end of a latch leg forms a rearwardly-facing shoulder 152. The latch legs 47 are resiliently deflectable, which helps in installing the circuit board with connectors thereon on the rear end cap, although this is not absolutely necessary. When the latch legs reach the cutouts such as 53, the lugs 51 snap into place, with the shoulders 150, 152 abutting and preventing separation of the circuit board and connector assembly from the rear end cap.

Thus, relative vertical movement (U, D) of the circuit board and rear connectors thereon is prevented by close receipt of the front end 140 of the electrical connector housing. Relative lateral movement (L) is prevented by either close lateral fitting of the electrical connectors to recesses in the rear end cap, or by close fitting of the circuit board opposite edges therein. Relative forward to rearward movement (F, R) is prevented by the front end of the electrical connector (or of the circuit board) abutting the front of recess walls in the rear end cap, and by latch legs with lugs that are received in cutouts at the sides of the circuit board.

The rear electrical connectors 11', 12' and rear end cap 16' are manufactured in large quantities and sold to customers. Each customer mounts circuit components such as integrated circuits on a circuit board, attaches the rear electrical connectors to the rear of the circuit board, and couples the rear of the circuit board and connectors thereat to the rear end cap (in addition to attaching the front connector and sheet metal housing). Because of the small height such as 5 mm of the IC card, it is often desirable to place the circuit board at slightly different elevations. Thus, if the circuit board is placed low with respect to the rest of the IC card, there will be more room above the upper surface of the circuit board, on which thicker circuit components can be mounted (though at the disadvantage of a thinner space below the circuit board). The components of the present IC card are constructed to allow mounting of the circuit board at different heights, with minimal changes to the other parts of the IC card.

Figure 9:
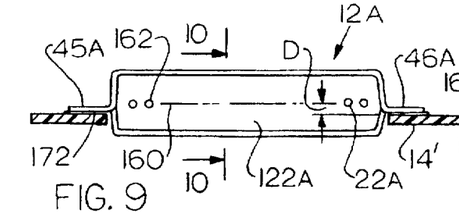
FIG. 9 is a view similar to that of FIG. 7, but with the connector constructed to hold the circuit board at a lower height.
Figure 10:
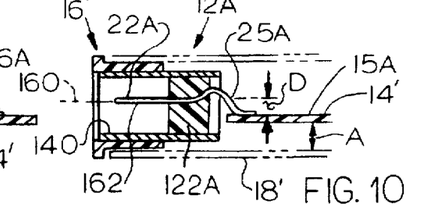
FIG. 10 is a sectional view taken on line 10—10 of FIG. 9 and that includes the rear end cap, with FIG. 10 being similar to FIG. 8 except that the circuit board lies at a lower height.

FIG. 10 shows a combination of the end cap 16', the circuit board 14', and a rear electrical connector 12A, which is designed to hold the circuit board 14' at a slightly lower height than that shown in FIG. 8. That is, in FIG. 10 the vertical distance A between the bottom of the circuit board 14' and the lower housing part 18' is less than the distance B in FIG. 8 between the circuit board 14' and the lower sheet metal housing part 18'. In the connector 12A of FIG. 10, the contacts 22A are formed with tails 25A that are differently bent than those of FIG. 8, so the front ends of the tails lie at a lower height. In addition, the tabs 45A, 46A (FIG. 9) of the connector sheet metal housing, are bent so their horizontal parts lie at a lower height. As a result, the front end 140 of the connectors of FIGS. 8 and 10 all lie at the same height and can be fitted into the rear end cap 16' in the same manner to fix the relative vertical height of the electrical connector to the rear end cap. However, the electrical connector holds the circuit board 14' at a different height A in FIG. 10 than the height B in FIG. 8, because of the different bending of the contact tails 25A in FIG. 10 which are molded into place into the insert 122A of the connector, and because of the different bending of the mounting tabs 45A, 46A (FIG. 9) of the sheet metal connector housing. If the contact tails are sufficiently resilient, a difference in mounting height can be accomplished with a spacer between the horizontal bottom of the tabs and the circuit board.

Another way of expressing the difference in height is to consider the rear electrical connector to have a horizontal centerplane 160 that passes through the rear pin mating ends 162 of the rear contacts. In FIG. 8, the upper surface 15 of the circuit board lies a distance C below the centerplane. In FIG. 10, the upper surface 15A of the circuit board lies a distance D below the centerplane 160. Similarly, in FIG. 7 the horizontal tab ends or mounts 170 of the connector housing lie a distance C below the centerplane 160, while in FIG. 9 the horizontal tab end or mount 172 lie at a different distance D below the centerplane.

To summarize, FIG. 6 shows that relative lateral movement of the end cap and board, in direction L, is prevented by engagement of the connector front end 140 with the walls of the recess and the end cap 16' and/or engagement of the side end parts 136 of the circuit board with the rear end cap. Relative movement in the forward and rearward directions F, R is prevented by engagement of the connector front end with the rear end cap (or engagement of the circuit board front edge with the rear end cap), and by engagement of the latch leg shoulders 152 with the shoulders 150 formed in cutouts in the circuit board side edges. FIG. 3 shows that the shoulder 152 of the lug does not have any grooves, so it can securely engage the circuit board at a plurality of different levels of the circuit board. It is possible to form steps in the shoulder 152, but it is generally undesirable to form grooves that are only about as wide as the circuit board. In practice, three different circuit board heights are called for.

Figure 4:
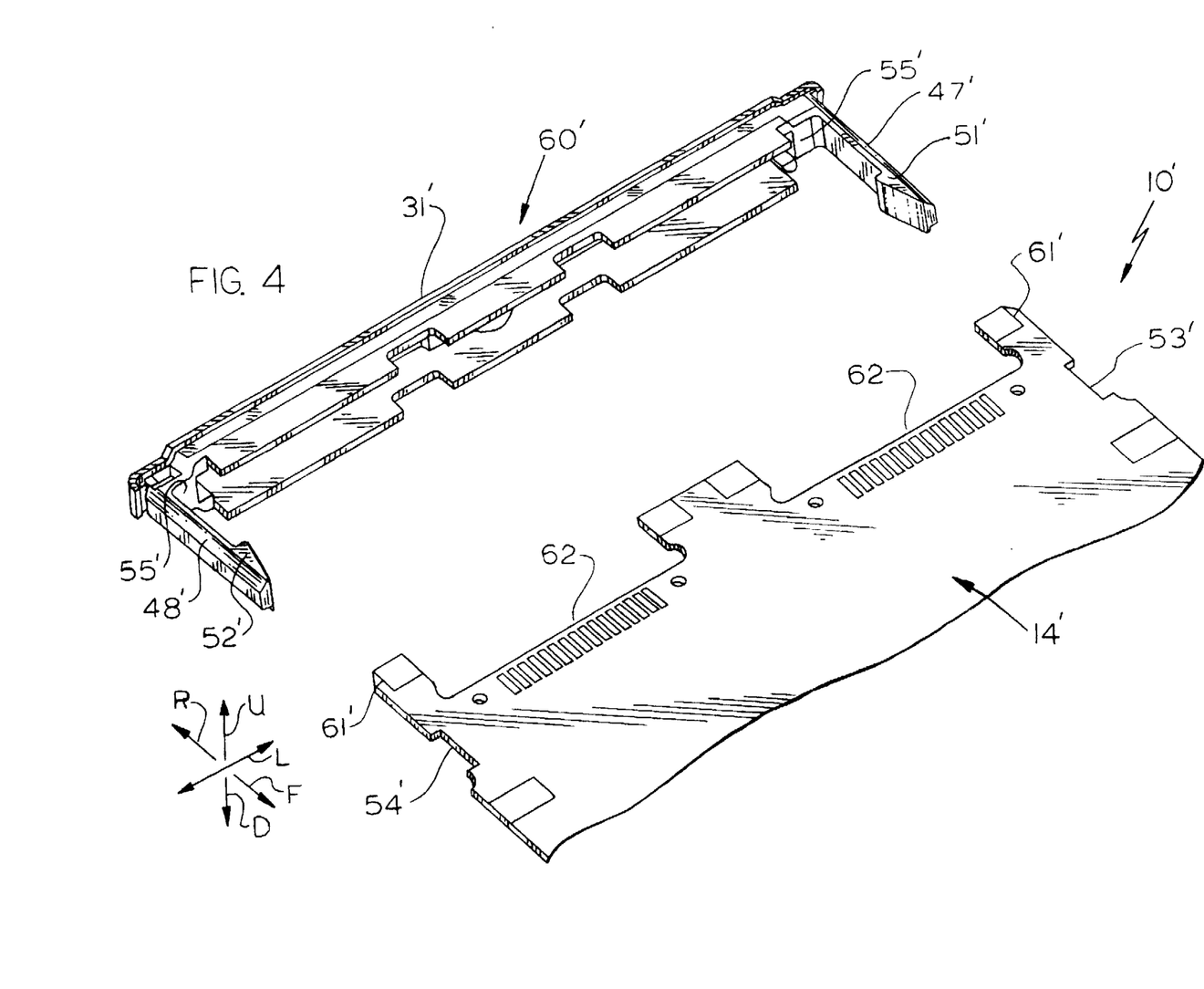
FIG. 4 is an exploded rear isometric view of the IC card of FIGS. 2 and 3, but showing only the end cap and a rear portion of the circuit board without connectors thereon, with the circuit board being slightly modified.
Figure 5:
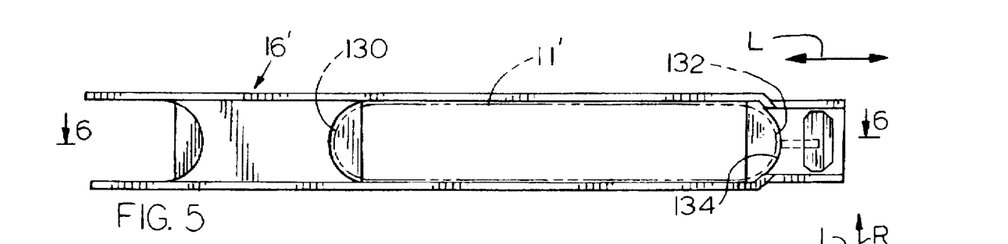
FIG. 5 is a rear view of one side of the end cap of FIG. 4 showing, in phantom lines, the rear end of a connector engaged with the rear end cap.

FIG. 3 shows that the rear end connector housing 120 has largely vertical tabs 56, 57 which can abut ribs 58, 59 of the rear end cap 16'. This can provide specific engaging surfaces that determine how far rearward the circuit board and rear end connectors move with respect to the rear end cap 16'. In FIG. 4, the circuit board 14' is constructed with end tongues 61' that abut surfaces 55' on the rear end cap, to limit rearward movement R of the circuit board 14' with respect to the rear end cap 60'. Otherwise, the rear end cap 60' and circuit board 14' of FIG. 4 are identical to those of FIGS. 2 and 3.

In FIGS. 2-10 (e.g. FIG. 3) the latch arms 47, 48 directly engage the side edges of the circuit board, while in FIG. 1 the latch arms 23, 24 directly engage the rear electrical connector(s). In each case, such engagement prevents forward (F) movement of the combination 180 or 182 of the circuit board-and-rear-connector (14, 11, and 12, or 14', 11' and 12') from moving forwardly out of engagement with the rear end cap. In FIG. 3, the lugs at the front end of the latch arms are free of narrow grooves, to engage circuit boards at different heights. In FIG. 1, the projections 114 at the front ends of the fingers are at a fixed height because the height of the rear connectors does not vary (except at their circuit board-engaging tabs).

Although terms "up", "down", etc. are used herein to describe the invention as illustrated, it should be understood that the IC card can be used in any orientation with respect to the Earth.

Thus, the invention provides an IC card, especially of the frameless type, with front and rear connectors that each have at least one row of contacts, with an improved rear board support structure. The rear board support structure includes a plastic molded rear end cap on which a sheet metal housing is mounted, and one or two rear electrical connectors that are connected to the rear of the circuit board and that engage the rear end cap. Each electrical connector is closely received in the rear end cap to prevent relative vertical movement. The rear end cap has forwardly-projecting latch arms at opposite sides thereof, with each latch arm having a lug at its front end that forms a rearwardly-facing shoulder. Each edge of the circuit board is formed with a cutout forming a forwardly-facing shoulder that engages the lug shoulder, to substantially prevent relative forward-to-rearward movement of the rear end cap with respect to the rear end connector and circuit board. The circuit board can be held at different heights by the use of different rear electrical connectors. Each electrical connector includes a housing that can be mounted at a selected height with respect to the circuit board, and that holds contacts with tails bent to lie at a certain height. Accordingly, by choice of the proper rear electrical connectors, applicant can mount the rear of the circuit board on the rear end cap, using the same end cap for all circuit board heights.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card which includes a circuit board (14') having front and rear ends (41, 104) and a laterally-extending row of circuit board contact pads (102, 62) at each of its ends, front and rear board support structures (40, 117) coupled respectively to said circuit board front and rear ends, wherein said front board support structure comprises a front connector with at least one row of electrical contacts engaged with the row of contact pads at said board front end, and a sheet metal cover (17') having upper and lower portions (19', 18') lying respectively over and under said circuit board, said cover having front and rear portions (116F, 116T, 116B) coupled respectively to said front and rear board support structures, wherein:

said rear board support structure includes at least one rear connector (11', 12') fixed to said board rear end, said rear connector having a rear connector end (110, 112) and having at least one row of rear contacts, said rear contacts having rear mating ends (162) and having contact tails (25', 25A) engaged with a rearward one of said row of circuit board contact pads;

said board rear end having opposite side edges (49, 50) with cutouts (53, 54) therein forming forwardly-facing shoulders (150);

said rear board support structure also includes a rear end cap (16') with a cap rear wall (31) having laterally spaced opposite sides and with a forwardly-extending leg (47, 48) at each of said sides with each leg having a lug (51, 52) projecting toward the other leg and forming a rearwardly-facing shoulder (152) lying in one of said board cutouts and substantially against the forwardly-facing shoulder thereof;

said cap rear wall having a through access opening (28', 29') for providing access to said rear mating ends of said rear contacts, and said rear end cap having a forward end with a recess (134) that closely receives said rear connector end to fix at least their relative vertical positions.

2. An IC card system which includes at least two types of IC cards, wherein each type of card includes a circuit board having front and rear ends and having laterally-extending front and rear rows of board contact pads at said ends, front and rear board support structures connected respectively to said board front and rear ends, and a sheet metal cover having upper and lower cover portions lying respectively over and under said circuit board, with said front and rear cover ends each coupled to one of said board support structures, but wherein in a first type of IC card the circuit board lies at a greater elevation relative to said cover than in a second type of IC card, wherein:

for each of said types of IC cards said rear board support structure includes a rear connector having a rear connector housing with a mount fixed to the board and a row of rear contacts mounted in the housing and having contact tails engaged with said board contact pads of said rear row of board contact pads, and with said rear connector housing having a rear end with a rear end centerplane;

for each of said types of IC card said rear board support structure includes a rear end cap with walls that closely receive said connector housing rear end to fix the relative vertical positions of the end cap and housing rear end;

for said first type of IC card, said rear connector has a housing of a first type, with its housing mount holding said first connector at a first height (C) on said circuit board relative to its rear end centerplane so the board lies high in the first type of IC card, and with the contact tails of said first connector extending to a first height (C) onto said rear row of contact pads;

for said second type of IC card, said rear connector has a housing of a second type, with its housing mount holding said second connector at a second height (D) on said circuit board relative to its rear end centerplane so the board lies lower in the second type of IC card, and with the contact tails of said second connector extending to a second height (D) that is lower than said first height, onto said rear row of contact pads.

3. The IC card system described in claim 2 wherein:

each of said rear connectors includes a metal shell and a molded plastic insert, with said rear contacts being molded into said plastic insert, with said metal shell forming said mount and having a plurality of mounts that lie facewise against a face of said circuit board;

the mounts (170, 172) of the rear connectors of said two types of IC cards lie at different heights (C, D) with respect to the centerplanes (160) of said rear connectors of said two types of IC cards.

4. The IC card system described in claim 2 wherein:

for each of said types of IC cards the circuit board rear end has opposite sides with cutouts therein forming forwardly-facing shoulders;

for each of said types of IC cards said rear end caps are the same, with each end cap having laterally spaced opposite sides and having a forwardly-extending leg at each of said sides with each leg forming a rearwardly-facing shoulder lying in one of said board cutouts and substantially against the forwardly-facing shoulder thereof.

5. An IC card which includes a circuit board having front and rear ends and a laterally-extending row of circuit board contact pads at each of its ends, a front connector with at least one row of electrical contacts engaged with the row of contact pads at said board first end, and a sheet metal cover having upper and lower portions lying respectively over and under said circuit board, said cover having front and rear portions with said cover front portions coupled to said front connector, including:

at least one rear connector fixed to said board rear end and having rear contacts engaged with contact pads at a row that lies at said board rear end, to form a combination of circuit board and rear connector;

a plastic molded rear end cap having upper and lower flanges and a plurality of forwardly-extending legs, said rear connector having a connector rear end that lies closely between said flanges to fix the relative vertical position of said rear connector to said rear end cap, and said rear end cap having at least one forwardly-projecting leg with a front end having a lug;

said combination of said circuit board and rear connector forming a slot which receives said lug to prevent the combination from moving forwardly so said end connector would move out from between said flanges.

6. The IC card described in claim 5 wherein:

said rear connector has a top with a vertically extending recess (25, 27) therein that forms said slot and said forwardly-projecting leg of said rear end cap extends from said upper flange (34T) with said lug projecting downwardly and fitting in said recess.

7. The IC card described in claim 5 wherein:

said sheet metal cover has opposite largely vertical sides;

said rear end cap has opposite sides and has a rearwardly-extending arm (32, 33) at each side, with each arm lying between a side edge of said circuit board and a vertical side of said sheet metal cover.

8. The IC card described in claim 5 wherein:

said circuit board rear end has cutouts (53, 54) at opposite sides thereof, with each cutout forming a forwardly-facing shoulder (150);

said at least one leg includes a pair of legs (47, 48) projecting forwardly from opposite sides of said rear end cap, with the lug (51) of each leg forming a rearwardly-facing shoulder (152) engaged with said forwardly-facing shoulder, with said rearwardly-facing shoulder being devoid of a groove of about the thickness of said circuit board so said rearwardly-facing shoulder can engage circuit boards lying at different heights.

9. An IC card which includes a circuit board having front and rear ends and a laterally-extending row of circuit board contact pads at each of its ends, front and rear board support structures coupled respectively to said circuit board front and rear ends, wherein said front board support structure comprises a front connector with at least one row of electrical contacts engaged with the row of contact pads at said board front end, and a sheet metal cover having upper and lower portions lying respectively over and under said circuit board, said cover having front and rear portions coupled respectively to said front and rear board support structures, wherein:

said rear board support structure includes at least one rear connector fixed to said board rear end, said rear connector having a rear connector end and having at least one row of rear contacts, said rear contacts having rear mating ends and having contact tails engaged with a rearward one of said row of circuit board contact pads;

said board rear end having opposite sides with cutouts therein forming forwardly-facing shoulders;

said rear board support structure also includes a rear end cap with a cap rear wall having laterally spaced opposite sides and with a forwardly-extending leg at each of said sides with each leg forming a rearwardly-facing shoulder lying in one of said board cutouts and substantially against the forwardly-facing shoulder thereof;

said cap rear wall having a through access opening for providing access to said rear mating ends of said rear contacts, and said rear end cap having a forward end with a recess that receives said rear connector end;

said rear connector housing has a mount that is mountable at a selected one of a plurality of heights on said circuit board to thereby position said circuit board at a selected height, with respect to said rear end cap;

said shoulders on said legs of said rear end cap are engageable with said board forward-facing shoulder at each of said selected heights of said board.

10. An IC card which includes a circuit board having front and rear ends and a laterally-extending row of circuit board contact pads at each of its ends, front and rear board support structures coupled respectively to said circuit board front and rear ends, wherein said front board support structure comprises a front connector with at least one row of electrical contacts engaged with the row of contact pads at said board front end, and a sheet metal cover having upper and lower portions lying respectively over and under said circuit board, said cover having front and rear portions coupled respectively to said front and rear board support structures, wherein:

said rear board support structure includes at least one rear connector fixed to said board rear end, said rear connector having a rear connector end and having at least one row of rear contacts, said rear contacts having rear mating ends and having contact tails engaged with a rearward one of said row of circuit board contact pads;

said board rear end having opposite sides with cutouts therein forming forwardly-facing shoulders;

said rear board support structure also includes a rear end cap with a cap rear wall having laterally spaced opposite sides and with a forwardly-extending leg at each of said sides with each leg forming a rearwardly-facing shoulder lying in one of said board cutouts and substantially against the forwardly-facing shoulder thereof;

said cap rear wall having a through access opening for providing access to said rear mating ends of said rear contacts, and said rear end cap having a forward end with a recess that closely receives said rear connector end to fix at least their relative vertical positions;

a second IC card assembly that is identical to said IC card, except that in said second IC card assembly said rear connector is fixed to said board rear end at a different height, so the distance between the height of said contact rear mating ends and a top surface of said circuit board is different than for second IC card assembly than for said IC card.

11. The IC card described in claim 10 wherein:

the rear connector of said IC card and the rear connector of said IC card device each have a centerplane and a metal housing with a horizontal tab end that lies soldered against said circuit board, with the tab end of one of said connectors vertically spaced from its connector centerplane differently than the spacing of the tab end of the other of said connectors from its connector centerplane.

* * * * *